United States Patent [19]

Usui

[11] Patent Number: 5,036,582

[45] Date of Patent: Aug. 6, 1991

[54] PARTS MOUNTING MACHINE

[75] Inventor: Hirokazu Usui, Nagoya, Japan

[73] Assignee: Nippondenso Co., Ltd., Kariya, Japan

[21] Appl. No.: 518,773

[22] Filed: May 3, 1990

[30] Foreign Application Priority Data

May 11, 1989 [JP] Japan .................................. 1-117971

[51] Int. Cl.⁵ ............................................ H05K 3/30
[52] U.S. Cl. ....................................... 29/740; 29/741; 29/714
[58] Field of Search .............. 29/740, 741, 759, 566.3, 29/566.4, 714

[56] References Cited

U.S. PATENT DOCUMENTS 4,819,969  4/1989  Brown et al. ......................... 29/741

Primary Examiner—Carl E. Hall
Attorney, Agent, or Firm—Cushman, Darby & Cushman

[57] ABSTRACT

A parts mounting machine for easily changing the type or number of parts being used within includes a work piece positioning device for positioning a work piece on a movable table thereon, and a plurality of part handling units which can be fixed to and detached from the work piece positioning device. Each of the parts handling units comprises mounting head means for holding a part and transferring it to the work piece, and transfer means for removing the part from a container and transferring the part to the mounting head means. Also contained in each handling unit is a controller for regulating the operation of the mounting head and transfer means. A main controller selectively controls the branch control means so that the parts handling units cooperate with the work piece positioning device as required by a user.

11 Claims, 10 Drawing Sheets

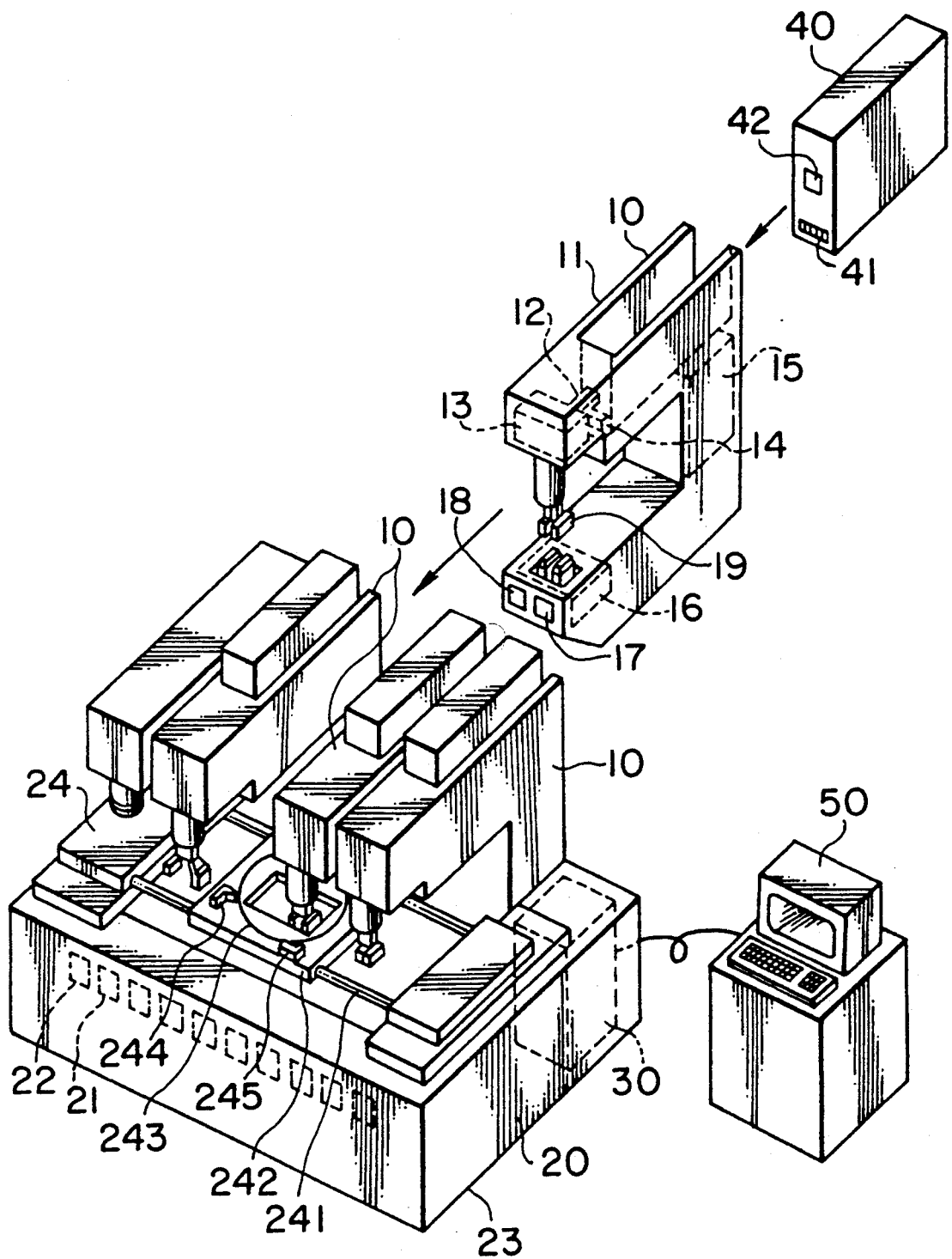

DATUM SIDE OF MASTER PIECE

TABLE REFERENCE POINT

MOUNTING CENTRAL POINT

PARTS MOUNTING MACHINE

BACKGROUND OF THE INVENTION AND RELATED ART STATEMENT

The present invention relates to a machine for mounting parts, more particularly to a machine which can mount various kinds of parts onto desired positions of a work piece.

An operation cycle of the above mentioned kind of machine includes the steps of:

removing a part from a container of parts, gripping the taken-out part in a mounting head, adjusting a direction and position of the part in the mounting head, mounting the adjusted part onto a desired position of a work piece, ascertaining whether the part is correctly mounted (this step may be deleted), fixing the mounted part to the work piece, and ascertaining whether the part is fixed correctly and securely on the work piece (this step may be deleted).

If the machine as above described is required to mount various kinds of parts in one operation cycle, it is necessary for the machine to have multiple removal devices, gripping devices, adjusting devices, mounting devices and fixing devices whose designs are changed in accordance with the shapes of the parts, and one main controller to control these devices.

In conventional parts mounting machines, it is difficult to exchange any one of the containers of parts, the removal devices, the gripping devices, the adjusting devices, the mounting devices, the fixing devices and a work-piece positioning device for the other one while still maintaining correct positional and operational-timing relations among them. Therefore, conventional parts mounting machines include problems as follows:

(1) When any one of the kinds of parts is exchanged for the other kind thereof, or a total number of the kinds of parts is increased, it is necessary to stop the operation of the parts mounting machine for a long time to remodel the machine.

(2) In order to prevent a number of the parts mounting machines from being remodeled to vary the kinds of parts mounted thereby, or in order to continue operating the parts mounting machines for a long term without remodeling thereof, it is necessary to make a long-term and detailed plan for managing the parts mounting machines. When the managing plan is disturbed once, it is difficult to reconstruct the managing plan to obtain the predetermined production.

OBJECT AND SUMMARY OF THE INVENTION

An object of the present invention is to provide a parts mounting machine which can be easily remodeled to vary the kinds of parts mounted thereby.

According to the present invention, a parts mounting machine comprises, work piece positioning device having a movable table for positioning a work piece at various desired places, a plurality of parts handling units detachably fixed to the work piece positioning device, each unit further comprising:

mounting head means fixedly attached to the unit, for holding a part and for mounting the part onto the work piece;

transfer means fixedly attached to the unit, for transferring the part from a container of parts to the mounting head means; and branch control means, for controlling the mounting head means and the transfer means; and a main controller, for selectively controlling the plurality of branch control means so that the parts handling units cooperate with the work piece positioning device.

Since each of the parts-handling-units includes the mounting head means and the transfer means cooperating with each other and fixed on one of the units detachably fixed on the work piece positioning device so that each of the parts-handling-units is fixed in relation to the work piece positioning device, it is not necessary that the parts-handling-unit fixed on the body be disassembled when one parts-handling-unit is removed from the parts mounting machine and another one is substituted for the removed parts-handling-unit, so that it is not necessary that the positional and operational-timing relations between the mounting head means and the transfer means in the removed parts-handling-unit be readjusted when the removed parts-handling-unit is fixed again in relation to the work piece positioning device. Moreover since the mounting head means and the transfer means in each of the parts-handling-units are controlled by one of the branch controllers to cooperate with each other and the branch controllers are selectively controlled by the main controller so that in accordance with a desired kind of parts the main controller selects a suitable parts-handling-unit to cooperate with the work piece positioning device, the main controller does not control the cooperation between the mounting head means and the transfer means in each of the parts-handling-units, instead it but controls the co-operation between the selected parts-handling-unit and the work piece positioning device. Thus it is not necessary for the main controller to consider the difference between the cooperation in the removed parts-handling-unit and the cooperation in the substitute parts-handling-unit. Therefore, the types of the parts-handling-units may be exchanged easily for the other ones to vary the kinds of parts mounted onto the work piece.

BRIEF DESCRIPTION OF THE DRAWINGS

FIG. 1 is a perspective view showing an embodiment of the present invention.

FIG. 4c is an enlarged view showing a part indicated by a broken line of FIG 4a.

DETAILED DESCRIPTION OF PREFERRED EMBODIMENTS

Figure 2A:
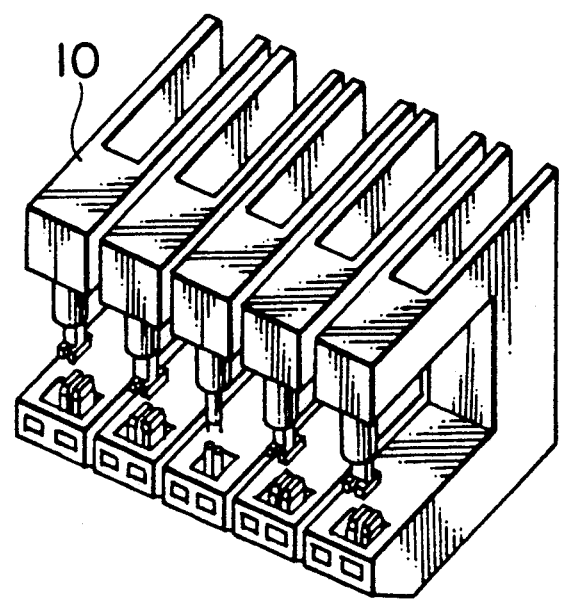
FIGS. 2a, 2b and 2c are perspective views showing parts-handling-units, a work piece positioning device, and containers of parts, respectively.
Figure 2B:
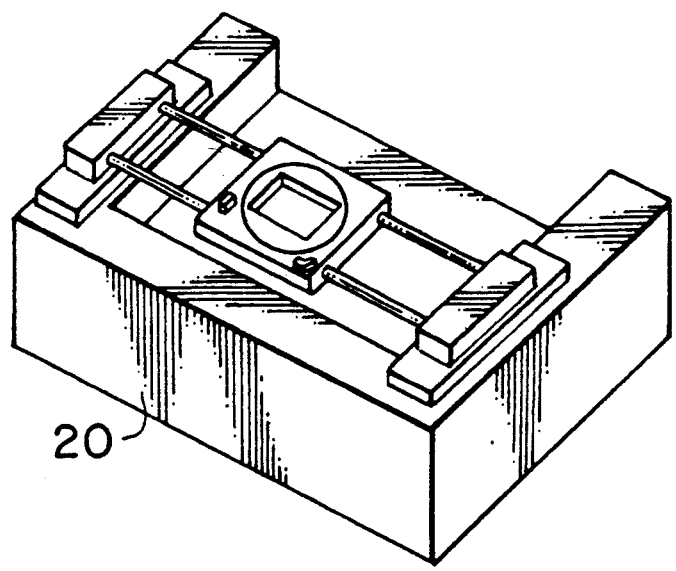
Figure 2C:
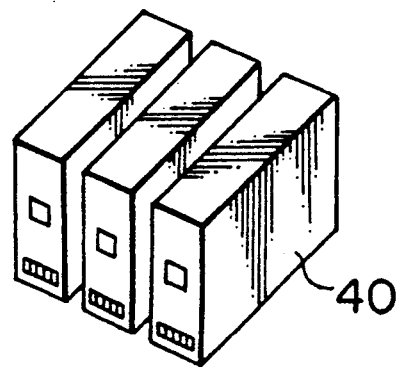

As shown in FIGS. 1, 2a, 2b and 2c, in one of the parts-handling-units 10, one of the parts-transfer devices 12, one of the mounting hand devices 13, one of the parts-code readers 14, one of the branch controllers 15 and one of the parts fixing devices 16 are securely fixed on one of the bodies 11. Each of the bodies 11 has a signal-interface opening 17 and a power-supply opening 18. One of the parts containers 40 is attached detachably to the body 11. Each of the parts containers 40 has thereon a code-mark 41 corresponding to the kind of parts contained in the parts container 40.

Each of the parts-transfer devices 12 transfers a part from a parts-container 40 to a mounting head 19 included by the mounting head devices 13. Each of the mounting head devices 13 moves the mounting head 19 between a part receiving place, at which the mounting head 19 receives the part transferred from the parts container 40, and a part mounting position, at which the mounting head 19 releases the part to mount it onto a work piece 71 positioned by a work piece positioning device 20. An air-cylinder or a linear servo electric actuator is used for the driving operation of the mounting head 19. Each of the parts-code readers 14 reads the code-mark, for example, the bar-code-mark 41 shown on the parts container 40, and informs the branch controller 15 of the kind of parts contained by the parts container 40. The parts containers 40 contain respective kinds of parts, and the parts are transferred through parts outlet 42.

When the branch controller 15 receives a mounting-operation-starting-signal from a main controller 30 through the signal-interface opening 17, the branch controller 15 outputs a work-piece-positioning-request-signal to the main controller 30. After the work piece positioning device 20 completes the work piece positioning operation according to the work-piece-positioning-request-signal and the part is transferred from the parts container 40 to the mounting head 19, the branch controller 15 operates the parts-handling-unit 10 to mount the transferred part onto the work piece 71. The parts fixing device 16 fixes the mounted part to the work piece. When the mounted part is a discrete IC with lead wires and the work piece is a printed circuit board with holes receiving the lead wires, the parts fixing device 16 cuts and clinches the lead wires received by the holes. When the mounted part is another kind of part, the parts fixing device 16 may have a screw tightening mechanism. In each of the parts-handling-unit 10, the designs of the mounting head 19 and of the parts fixing device 16 are changed in accordance with the kind of parts handled. The signal-interface opening 17 and the power-supply opening 18 of the parts-handling-unit 10 are connected to a signal-interface opening 21 and a power-supply opening 22 of the work piece positioning device 20, respectively, when the parts-handling-unit 10 is attached on the work piece positioning device 20. The branch controllers 15 communicate with the main controller 30 through the signal-interface openings 17 and 21, and the electricity and fluid power for the parts-handling-unit 10 is supplied through the power-supply openings 18 and 22.

Each of the parts-handling-units 10 is detachably fixed on the work piece positioning device 20. In order that the datum points of the parts-handling-units 10 can be set as correctly as possible at respective desired positions in relation to the work piece positioning device 20, each of the parts-handling-units 10 has two positioning holes (not shown) on an attaching surface thereof, and the work piece positioning device 20 has sets of positioning pins (not shown) each set of which has two positioning pins fitted respectively in the two positioning holes of the parts-handling-units 10. After the parts-handling-unit 10 is set on the work piece positioning device 20, the attaching surface of the parts-handling-unit 10 is pressed against an attaching surface of the work piece positioning device 20. The work piece positioning device 20 has a bed 23 and a table driving device 24 fixed on the bed 23. A X-Y table 242 is movable on shafts 241 and is positioned by a combination of a screw-nut unit and a servo motor (not shown) in a longitudinal direction of the shafts 241 which are positioned by another combination of a screw-nut unit and a servo motor (arranged in the table driving device 24) in a direction perpendicular to the longitudinal axes of the shafts 241, so that the X-Y table 242 is movable and positioned on a plane. A X-direction length measuring device 244 and a Y-direction length measuring device 245 are arranged at respective corners of the table 242, and an indexing table 243 is arranged at the center of the X-Y table 242. The work piece is set on the indexing table 243.

After the parts-handling-units 10 are fixed at respective positions on the work piece positioning device 20, the main controller 30 investigates magnitudes of deviations of the actual positions of the datum points of the fixed parts-handling-units 10 from the respective intended positions thereof. Thereafter, when the main controller 30 receives mounting operation instructing signals inputted through a control panel 50, the main controller 10 selects one of the parts-handling-units 10 in accordance with data included by the mounting operation instructing signal, outputs a mounting operation starting signal to the selected parts-handling-unit 10, and instructs the work piece positioning device 20 to position the tables 242 and 243 on the basis of the work-piece-positioning-request-signal outputted by the selected parts-handling-unit 10. When the selected parts-handling-unit 10 completes one mounting operation cycle as above described after the work piece positioning device 20 has positioned the work piece, the main controller repeats the above described operation cycle. Each of the mounting operation instructing signals includes data showing the type of parts-handling-unit 10 needed, the kind of parts needed, a position at which the part is mounted on the work piece, an attitude of the mounted part, and limitations of the operation of the parts-handling-unit 10.

Figure 3:
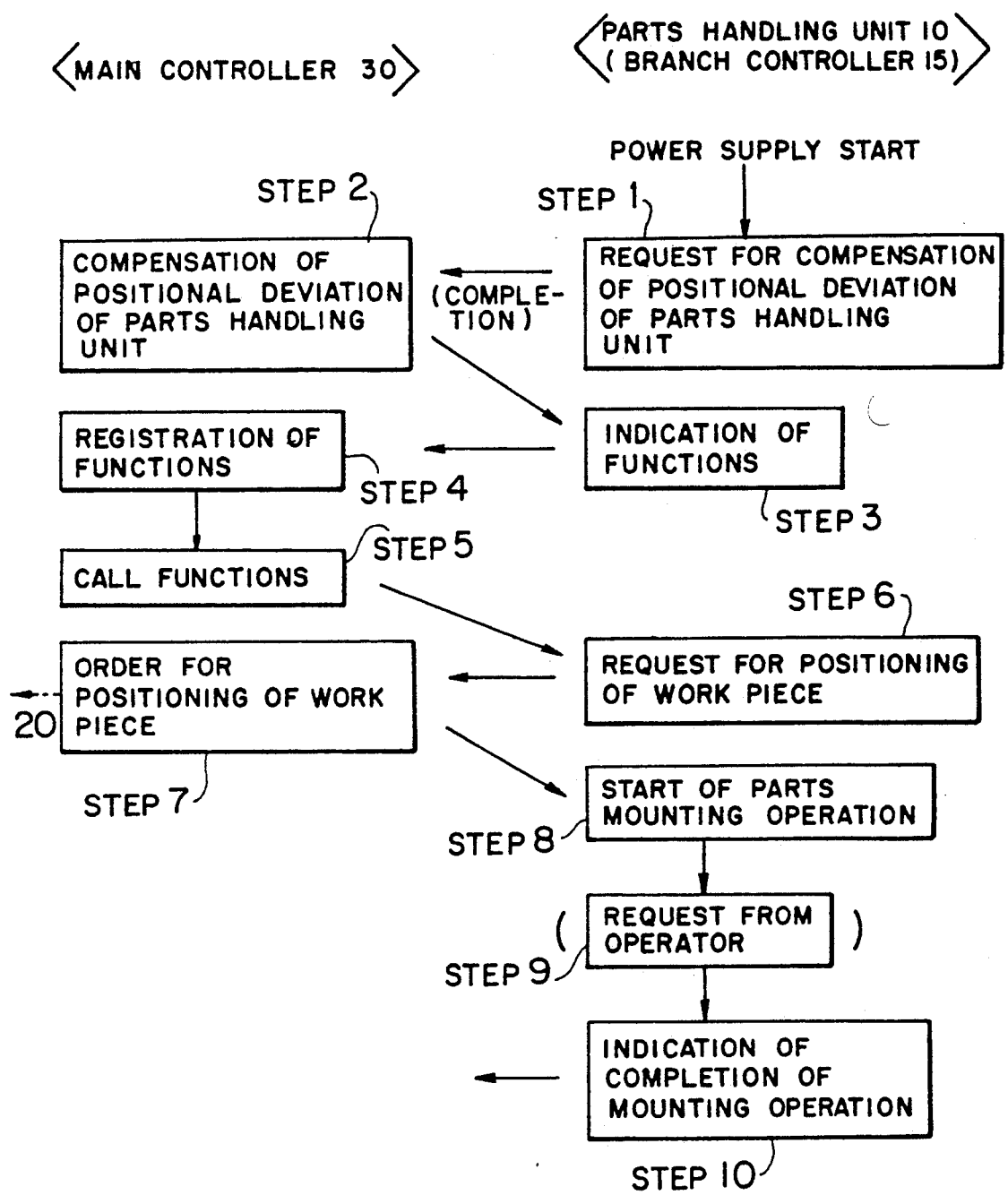
FIG. 3 is a flow-chart diagram showing operational steps of the embodiment of FIG. 1.

The operation of the parts mounting machine according to the present invention includes three stages as described below. In order to explain the operation intelligibly, it is supposed that the indexing table 243 is held at its reference rotational position. When the parts mounting machine has a plurality of the parts handling units, a compensating operation as described below is repeated according to the number of parts handling units being used. In stage 1, a master piece 72 is set correctly on the indexing table 243 by at least three positioning pins 251 which extend from the indexing table 243 and against which at least two datum sides of the work piece 71 or of the master piece 72 are pressed by an elastic member (not shown). Subsequently, the main controller 30 is requested via a control panel 50 to measure an actual distances between the datum point of the X-Y table 242 and the datum sides of the master piece correctly set by the positioning pins 251, that is, the actual distances between the datum point of the X-Y table 242 and the datum line of the positioning pins 251, in X and Y directions perpendicular to each other, as described below in detail. The measured distance is memorized in the main controller 30. Thereafter, the master piece 72 is replaced by the work piece 71. In stage 2 as shown in steps 1 to 4 of FIG. 3, after the parts-handling-units 10 are fixed on the work piece positioning device 20 and the electricity is supplied from the parts mounting machine, the branch controllers 15 request the main controller 30 to compensate the deviations of the actual positions of the datum points of the fixed parts-handling-units 10 from the respective intended positions thereof (step 1). In step 2, when the main controller 30 receives this request, the parts mounting machine is controlled by the main controller 30 to measure the actual distances between the datum points of the fixed parts-handling-units and the X-Y table reference point, and the measured distance is memorized in the main controller 30, as described below in detail. In Step 3, subsequently, the branch controller 15 of each of the parts-handling-units 10 outputs data showing the type of function performed by the parts-handling-unit 10 and a part kind read by a parts code reader 14 to the main controller 30. In step 4, the main controller 30 memorizes data therein. In stage 3 as shown in steps 5 to 10 of FIG. 3, the main controller 30 selects one of the parts-handling-units 10 suitable for mounting the first kind of parts and outputs a mounting operation starting signal to the selected parts-handling-unit 10 (step 5) after the memorized functional data of the parts-handling-units 10 has been compared with the first in a series of mounting operation instructing signals inputted to the main controller 30 through the control panel 50. In step 6, the selected parts-handling-unit 10 outputs a compensated-positioning data which is calculated by the branch controller 15 in accordance with distances in the X and Y directions between the datum point of the selected parts-handling-unit 10 and the datum point of the handled part on the basis of the mounting operation starting signal including data showing a position where the part is mounted on the work piece 71. The distances in the X and Y directions between the datum point of the selected parts-handling-unit 10 and the datum point of the handled part were previously measured. In step 7, after the main controller 30 receives the compensated-positioning data, the main controller 30 calculates distances in the X and Y directions between the X-Y table reference point and the datum points of the X-Y table 242 as below described, which distances are required for positioning suitably the X-Y table 242. In step 8, when the selected parts-handling-unit 10 receives a positioning completion signal outputted by the main controller 30 after the X-Y table 242 has been correctly positioned, the selected parts-handling-unit 10 starts its mounting operation controlled by the branch controller 15, in which the mounting head having the part transferred from the parts container 40 to the mounting head 19 of the mounting head devices 13 by the parts-transfer device 12 descends to the work piece and releases the part to mount it thereon. After the part has been mounted on the work piece, if the part has the lead wires received by the holes of the work piece, the parts fixing device 16 cuts the lead wires at suitable length and clinches the remaining wires. If it is confirmed that the part is securely and correctly fixed on the work piece, one mounting operation cycle is completed. If the mounted part, for example, a wire, has two portions fixed to the work piece, the steps 6 to 8 are repeated and the compensated-positioning data is changed in accordance with a positional difference between the hands 191 and 192. When a problem occurs in the parts-handling-unit 10, for example, when all of the parts in the parts container 40 have been transferred, the operation of the parts mounting machine proceeds to step 9, in which the branch controller outputs an operator request signal. In step 10, when one mounting operation cycle is completed, the branch controller 15 outputs a mounting operation completion signal to the main controller 30. When the main controller 30 receives the mounting operation completion signal, the main controller 30 selects the next one of the parts-handling-units 10 suitable for mounting the next kind of parts in accordance with the next mounting operation instructing signals, so that the mounting operation cycle is repeated according to the total number of mounting operation instructing signals in the series.

Figure 4A:
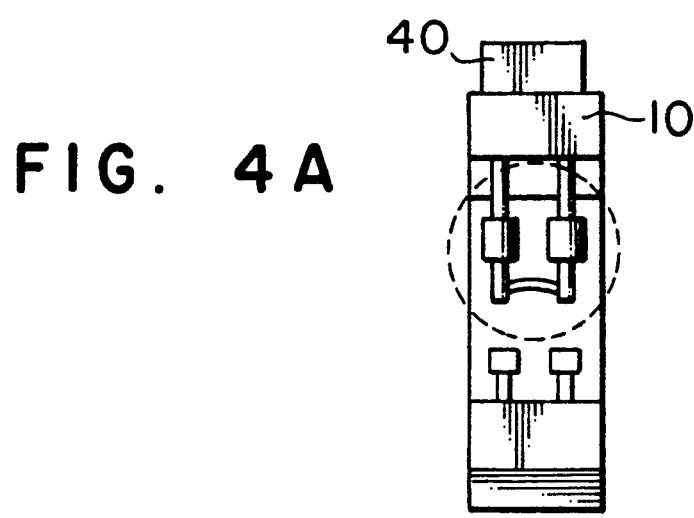
FIGS. 4a and 4b are a front view and a side view, showing the parts-handling-unit.
Figure 4B:
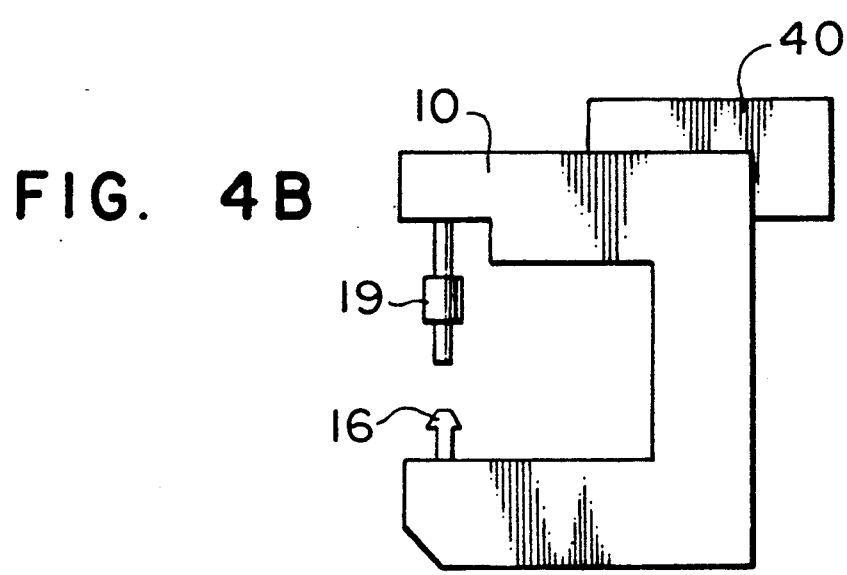
Figure 4C:
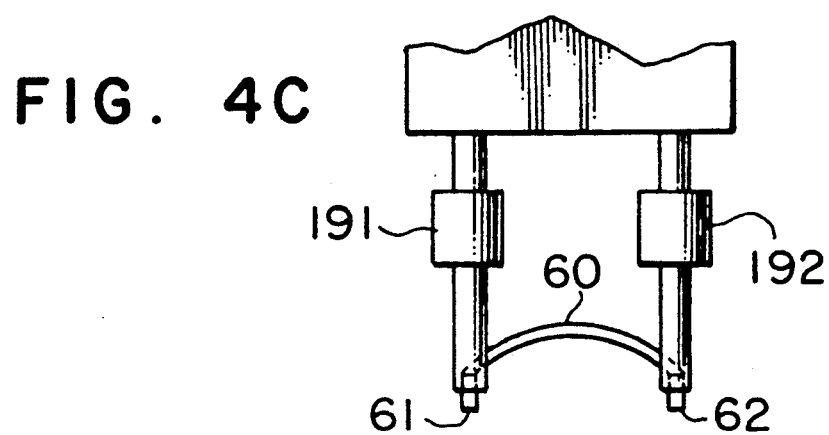

The operation cycle for mounting the wire is described more in detail as follows. FIG. 4 shows the parts-handling-unit 10 suitable for mounting wire 60, FIG. 5 shows operational steps for mounting the wire 60, whose first step starts after the above mentioned step 5 of FIG. 3.

Figure 5:
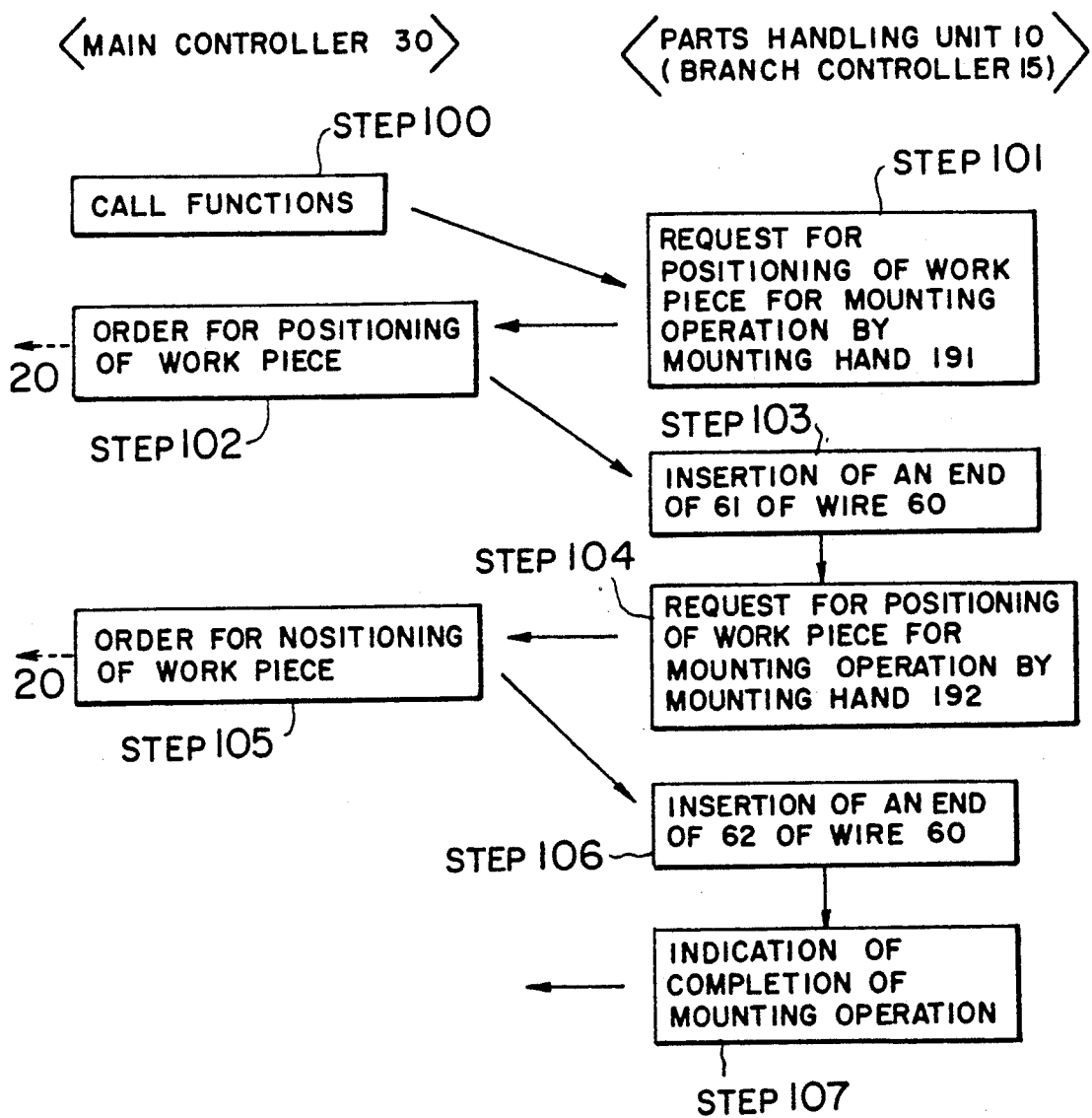
FIG. 5 is a flow-chart diagram showing operational steps for mounting a wire in the embodiment of FIG. 4.

As shown in FIG. 5, in step 100, the parts-handling-unit 10 receives the mounting operation starting signal from the main controller 30, and in step 101, the parts-handling-unit 10 outputs the compensated positioning data for appropriately positioning the work piece in relation to the mounting head 191 gripping an end 61 of the wire 60. In step 102, after the main controller 30 receives the compensated positioning data, the main controller 30 calculates a rotational degree of the indexing table 243 and distances in the X and Y directions between the X-Y table reference point and the datum points of the X-Y table 242, which rotational degree and distances are required for positioning a desired hole of the work piece 71 correctly in relation to the end 61. The work piece positioning device 20 positions the X-Y table 242 and the indexing table 243 in accordance with the calculated rotational degree and distances. This calculation will be described below in detail. In step 103, when the parts-handling-unit 10 receives the positioning completion signal outputted by the main controller 30 after the X-Y table 242 and the indexing table 243 have been correctly positioned, the mounting head 191 having the end 61 descends to the work piece and inserts the end 61 into the desired hole. Subsequently, in step 104, the parts-handling-unit 10 outputs the compensated positioning data for appropriately positioning another hole of the work piece 71 in relation to a mounting head 192 gripping an end 62 of the wire 60. In step 105, after the main controller 30 receives the compensated positioning data, the main controller 30 calculates the rotational degree of the indexing table 243 and the distances in the X and Y directions between the X-Y table reference point and the datum points of the X-Y table 242, which rotational degree and distances are required for positioning the other desired hole of the work piece 71 correctly in relation to the end 62. The work piece positioning device 20 positions the X-Y table 242 and the indexing table 243 in accordance with the calculated rotational degree and distances. In step 106, when the parts-handling-unit 10 receives the positioning completion signal outputted by the main controller 30 after the X-Y table 242 and the indexing table 243 have been correctly positioned, the mounting head 192 gripping the end 62 descends to the work piece 71 and inserts the end 62 into the desired hole. In step 107, when one mounting operation cycle is completed, the branch controller 15 outputs the mounting operation completion signal to the main controller 30.

In order to intelligibly explain the measuring and calculating operation of the parts mounting machine according to the present invention, it is supposed that the indexing table 243 is held at its reference rotational position, and only the measuring and calculating operation in the X direction is explained. The measuring and calculating operation of the Y direction is performed in the same way as that of the X direction.

Figure 6A:
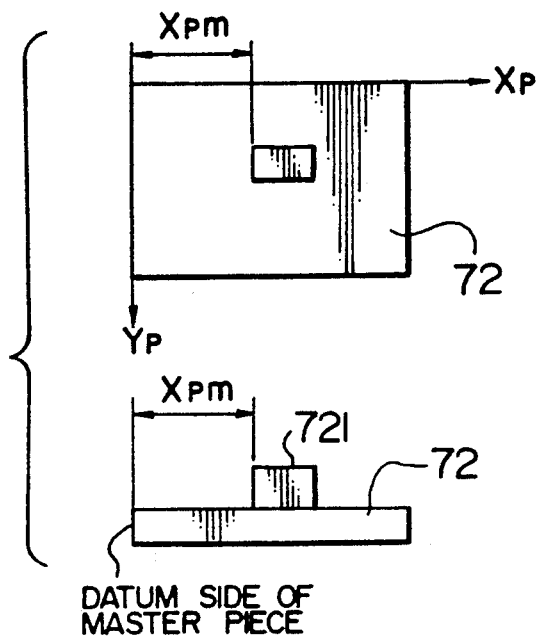
FIGS. 6a, 6b, 6c and 6d are schematic views showing data used in a positional compensating operation.
Figure 6B:
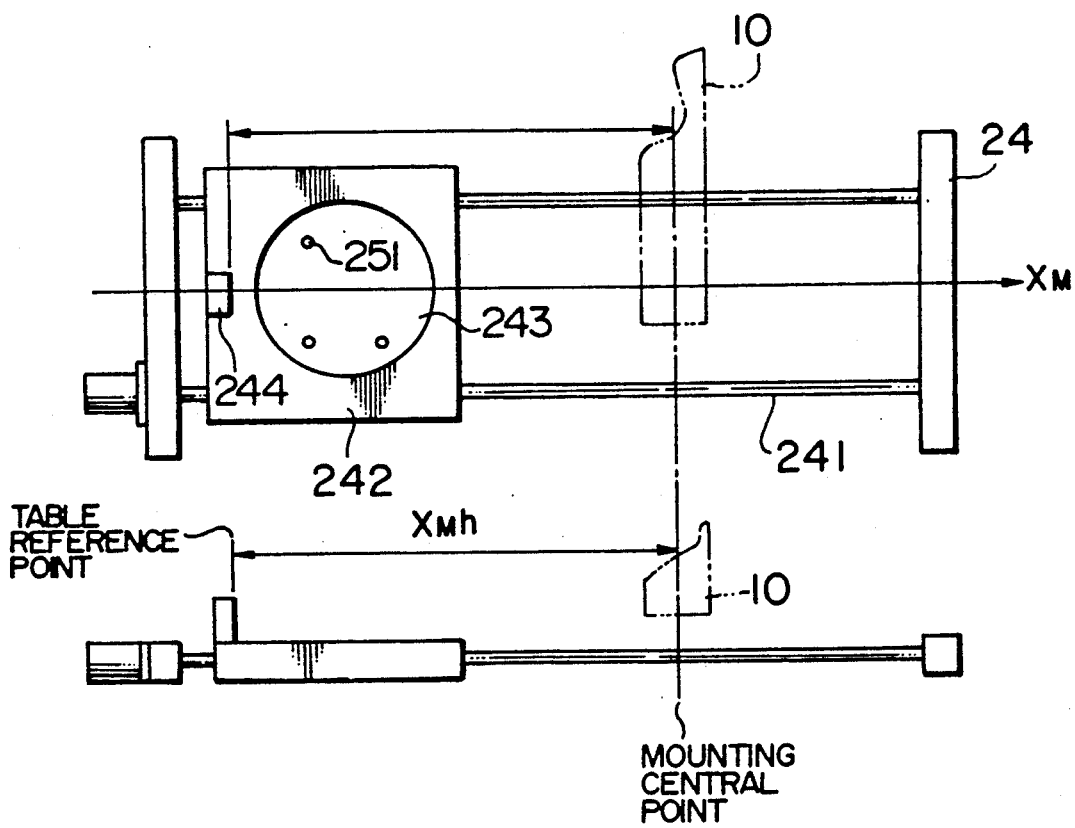
Figure 7A:
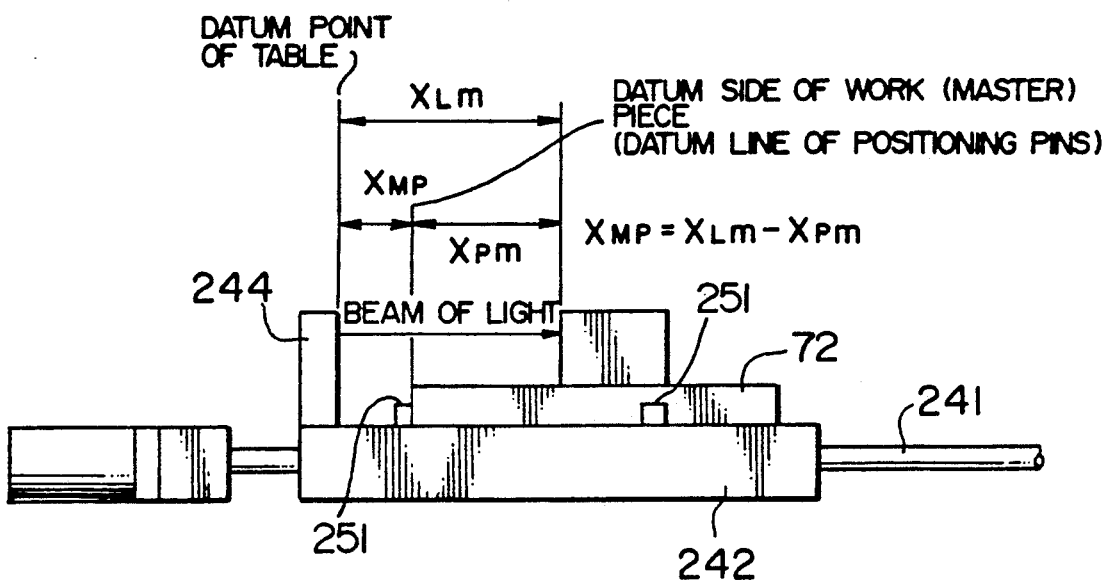
FIG. 7a is a schematic view for explaining a method for measuring a distance between a datum point of a work piece positioning table and a work piece setting point.

When the parts mounting machine measures the distance $X_{MP}$ between the X-direction datum point of the X-Y table 242 and the X-direction datum line of the positioning pins 251 contacting and setting the X-direction datum side of the work piece 71, the master piece 72 is set correctly by the positioning pins 251 on the indexing table 241. As shown in FIG. 6a, the master piece 72 has a square column 721 whose one datum master surface is perpendicular to the mounting surface of the indexing table 243 and is parallel to the X-direction datum side of the master piece 72. The distance $X_{PM}$ between the X-direction datum side of the master piece 72 and the datum master surface was previously measured by a measuring machine and is memorized in the main controller 30. When the distances on the X-Y table 242 are measured by an optical length measuring device 244 attached on the X-Y table 242 as shown in FIG. 7A, the reference point of the optical length measuring device 244 is the X-direction datum point of the X-Y table 242. The optical length measuring device 244 measures a distance $X_{LM}$ between the X-direction datum point of the X-Y table 242 and the datum master surface. The main controller 30 calculates the distances $X_{MP}$ from the measured distance $X_{LM}$ and the predetermined distance $X_{PM}$, that is, the difference between the distance $X_{LM}$ and the distance $X_{PM}$ is the distance $X_{MP}$ between the X-direction datum point of the X-Y table 242 and the X-direction datum line of the positioning pins 251, as shown in FIG. 7a. The distance $X_{MP}$ is memorized in the main controller 30.

Figure 6C:
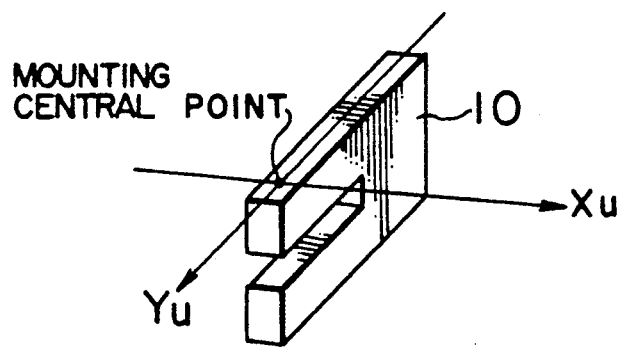
Figure 6D:
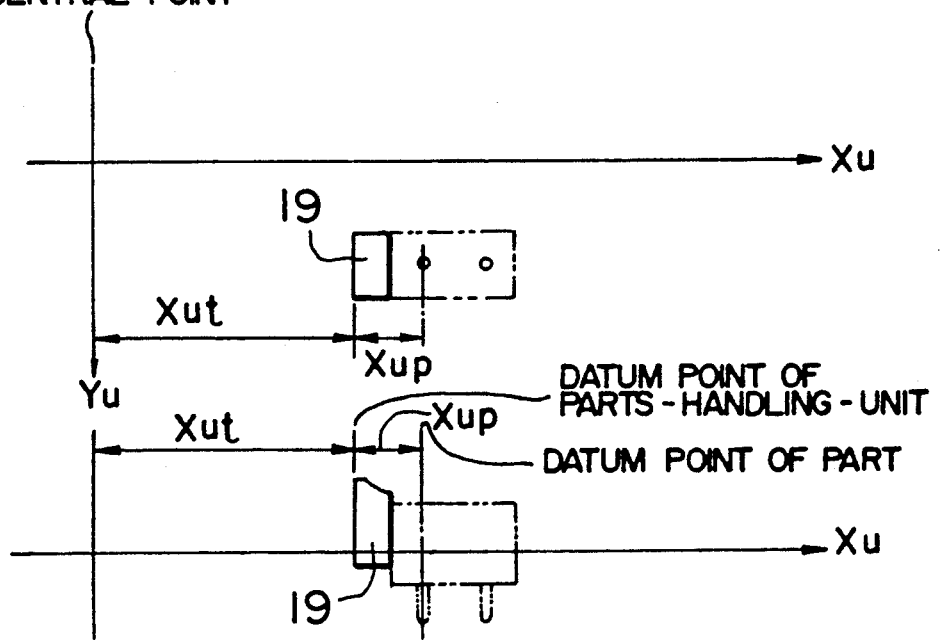

The approximate distance $X_{MH}$ between the X-Y table reference point and the mounting central point of each of the parts-handling-units 10 is memorized in the main controller 30. The mounting central point of each of the parts-handling-units 10 may be the center point of the positioning hole of the parts-handling-unit 10 or may be any point of the parts-handling-units 10, as in FIG. 6c. The approximate distance $X_{UT}$ between the mounting central point and the datum point of the parts-handling-unit 10 and the distance $X_{up}$ between the datum point of the parts-handling-unit 10 and the datum point of the handled part were previously measured and memorized in the branch controller 15. The datum point of the parts-handling-unit 10 may be an end surface of the mounting head 19, as shown in FIG. 6d. The distance $X_{UT}$ is output to the main controller in the stage 2.

Figure 7B:
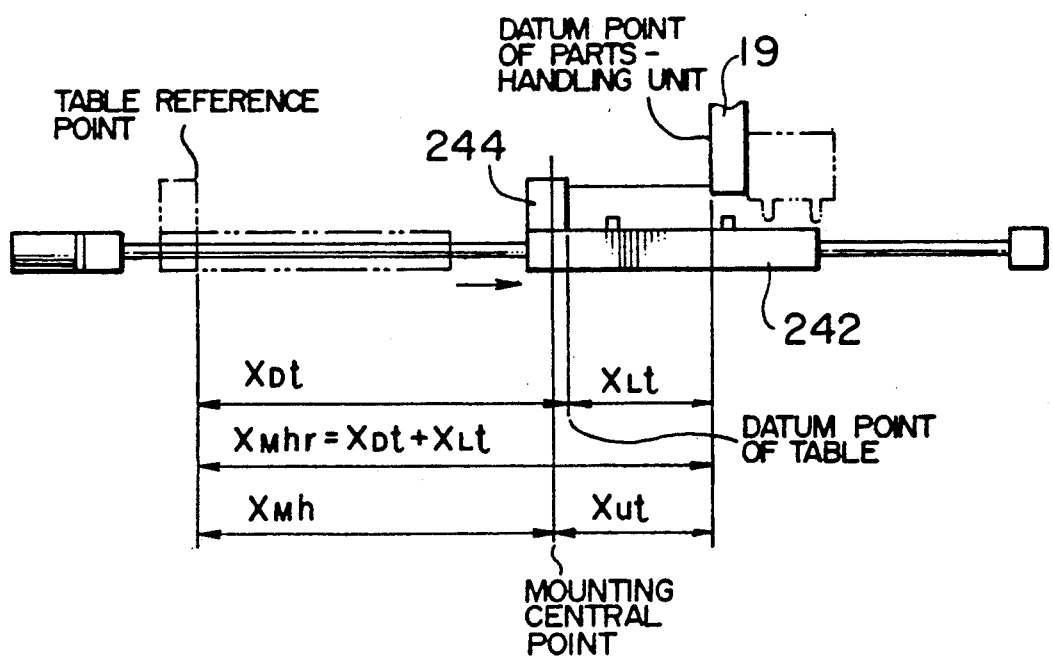
FIG. 7b is a schematic view for explaining a method for measuring a distance between the datum point of the work piece positioning table positioned at its initialized position and a datum point of a parts-handling-unit.

When the parts mounting machine is requested by the branch controller 15 to compensate the deviation of the actual position of the datum point of each of the parts-handling-units 10 from the intended position thereof, that is, to measure the actual distance between the datum point of each of the parts-handling-units 10 and the X-Y table reference point, the X-Y table 242 is at first positioned at its initialized position so that the reference point of the optical length measuring device 244 is positioned at the X-Y table reference point as shown by the broken line in FIG. 7b. Subsequently the X-Y table 242 is moved by a distance $X_{DT}$, which is less than the sum amount of the distance $X_{UT}$ and the distance XMH, that is, $XDT = X_{MH} + X_U - X_{LT}$, ($X_{LT}$, is a certain distance measurable by the optical length measuring device 244), and the optical length measuring device 244 measures a distance $X_{LT}$ between the reference point of the optical length measuring device 244 and the end surface of the mounting head 19, that is, the datum point of the parts-handling-unit 10. A sum total of the distance $X_{DT}$ and the distance $X_{LT}$ is the actual distance $X_{MHR}$ between the datum point of each of the parts-handling-units 10 and the X-Y table reference point. The actual distance $X_{MHR}$ is memorized in the main controller 30.

Figure 8A:
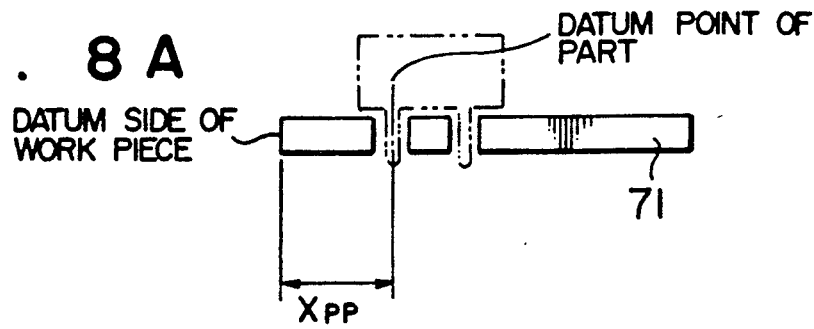
FIGS. 8a, 8b and 8c are schematic views for explaining a method for calculating a distance between the initialized position of the work piece positioning table and a mounting position thereof at which a work piece correctly set o work piece positioning table by the work piece point is positioned adequately in relation to the parts-handling-unit.
Figure 8B:
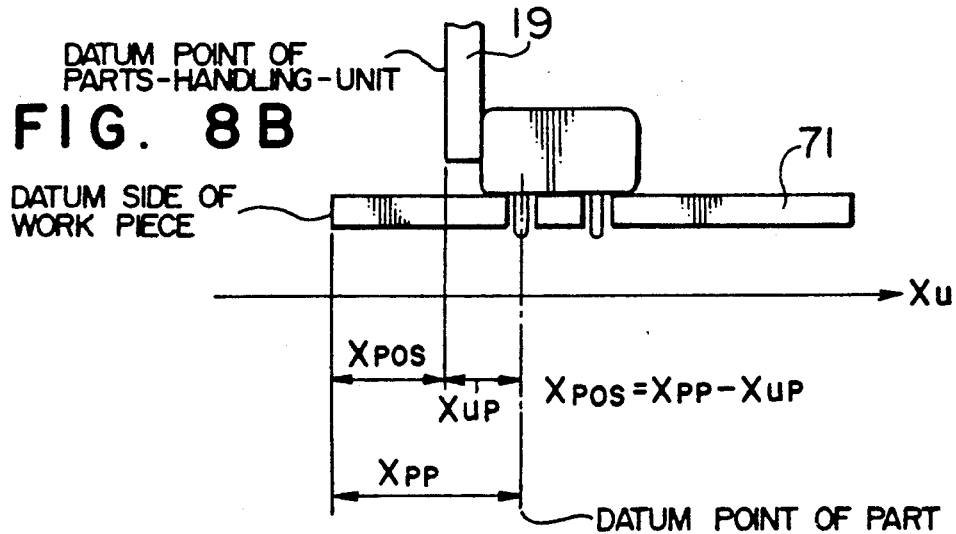
Figure 8C:
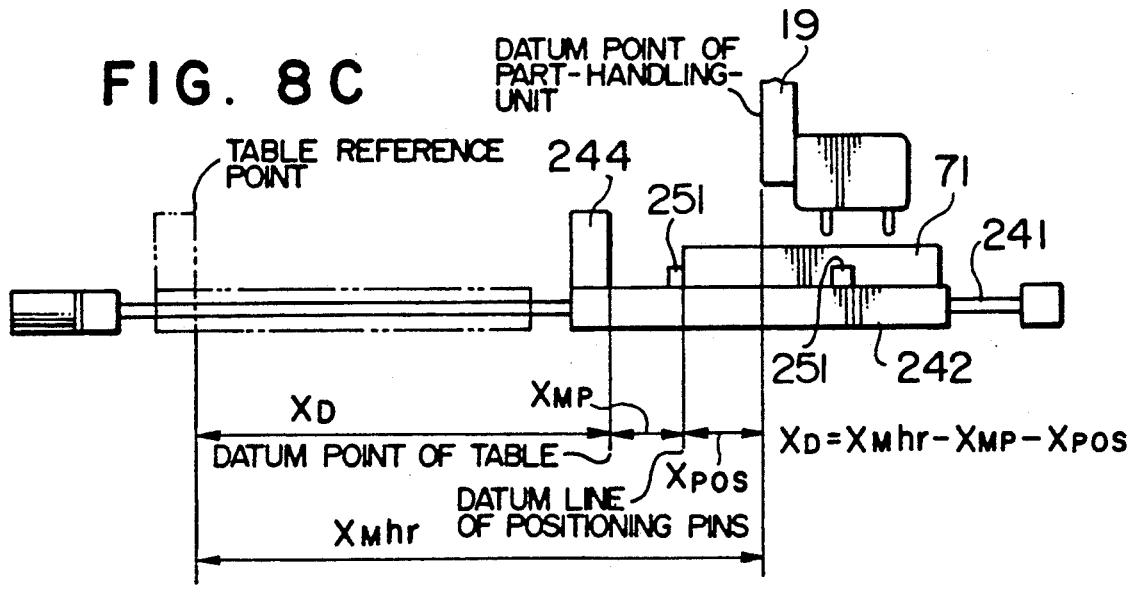

As shown in FIGS. 8a, 8b and 8c, when the parts-handling-unit 10 receives the mounting operation starting signal from the main controller 30, including the distance data Xpp between the X-direction datum side of the work piece 71 and the position where the datum point of the mounted part should be positioned on the work piece 72, the branch controller 15 calculates the compensated-positioning data $X_{pos}$ between the datum point of the parts-handling-unit 10 and the X direction datum line of the positioning pins 251 contacting with the X-direction datum side of the work piece 71, in accordance with the distance $X_{UP}$ between the datum point of the parts-handling-unit 10 and the datum point of the handled part on the basis of the data $X_{pp}$, that is, $$X_{pos} = X_{pp} - X_{UP}.$$

The branch controller 15 outputs the compensated-positioning data $X_{pos}$ to the main controller 30. When the main controller 30 receives the compensated-positioning data $X_{pos}$, the main controller 30 calculates the distance $X_D$ between the X-Y table reference point and the datum point of the X-Y table 242 in accordance with the distance $X_{MP}$ between the X-direction datum point of the X-Y table 242 and the X-direction datum line of the positioning pins 251 and the distance $X_{MHR}$ between the datum point of the parts-handling-unit 10 and the X-Y table reference point, that is, $$X_D = X_{MHR} - X_{MP} - X_{pos}.$$

The X-Y table 242 is positioned in accordance with the distance data $X_D$.

Figure 9:
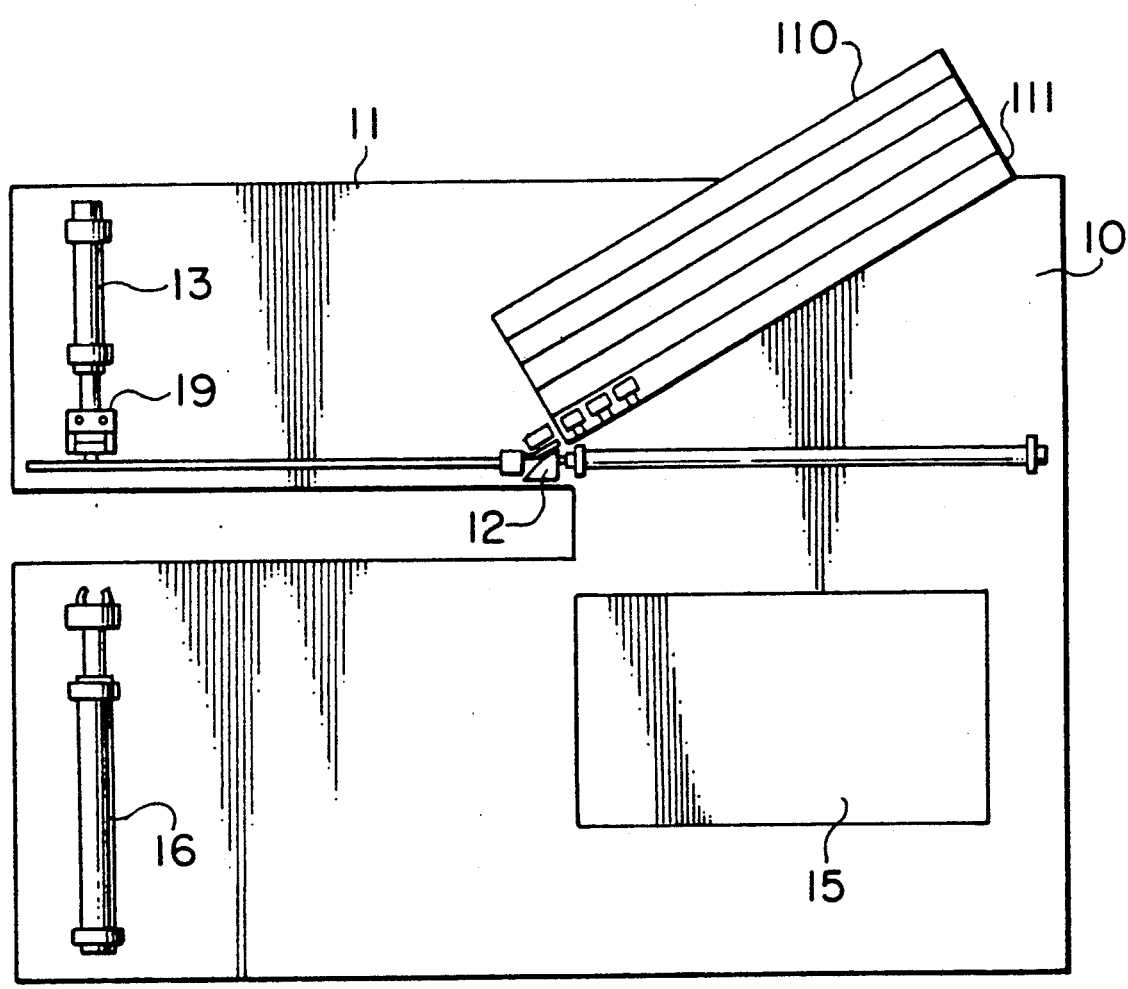
FIG. 9 is a schematic partially cross-sectional view showing an inner structure of the parts-handling-unit.

The parts container 40 as above described is attached detachably on the parts-handling-unit 10, however, the parts container may be integrally formed with the parts-handling-unit 10, as shown in FIG. 9. Therein, the part slides downwardly in a magazine 111 of an inclined cartridge 110, and a forward end of the parts-transfer device 12 catching the part moves to the left to transfer the part to the mounting head 19 of the mounting head devices 13. Subsequently, the mounting head 19 gripping the part descends to mount the part on the work piece 71. Thereafter, the parts fixing device 16 ascends to fix the part to the work piece 71.

In this embodiment, since the cartridge 110 was previously fixed on the parts-handling-unit 10, it is not necessary to adjust a positional relation between the parts-handling-unit 10 and the cartridge 110, and a device for taking out the part from the parts container is not needed.

What is claimed is:

1. A parts mounting machine comprising:
   a work piece positioning device having a movable table for positioning a work piece at a predetermined location thereon:
   a plurality of parts handling units detachable fixed to the work piece positioning device, each unit further comprising:
   mounting head means fixedly attached to the unit, for holding a part and for mounting the part onto the work piece;
   transfer means fixedly attached to the unit, for transferring the part from a container of parts to the mounting head means; and
   branch control means, for controlling the mounting head means and transfer means; and
   a main controller, for selectively controlling the branch control means so that the parts handling units cooperate with the work piece positioning device.

2. A parts mounting machine according to claim 1, wherein each of the mounting head means includes a head whose one end surface is a datum point in relation to the mounted part and the work piece positioning device.

3. A parts mounting machine according to claim 1, wherein the branch controllers are fixed on the respective parts handing units.

4. A parts mounting machine according to claim 1, wherein the work piece positioning device has an indexing table.

5. A parts mounting machine according to claim 1, wherein the work piece positioning device has at least three positioning pins against which at least two datum sides of the work piece are pressed.

6. A parts mounting machine according to claim 1, wherein the branch control means outputs data showing a function performed by the respective parts handling unit to the main controller, and the main controller memorizes said data.

7. A parts mounting machine according to claim 6, wherein the main controller compares said data with a first mounting operation instruction signal inputted to the main controller, selects one of the parts handling units suitable for mounting a first kind of parts, and generates a mounting operation starting signal indicative thereof to the selected parts handling unit.

A parts mounting machine according to claim 6, wherein the selected parts handling unit generates a compensated-positioning data signal which is calculated by the respective branch controller in accordance with distances in the X and Y directions between the datum point of the selected parts handling unit and the datum point of the starting signal including distance data between a datum side of the work piece and a position where a datum point of the part should be mounted on the work piece.

8. A parts mounting machine according to claim 6, wherein the selected parts-handling-unit outputs a compensated-positioning data which is calculated by the branch controller in accordance with distances in the X and Y directions between the datum point of the selected parts-handling-unit and the datum point of the handled part on the basis of the mounting operation starting signal including distance data between a datum side of the work piece and a position where a datum point of the part should be mounted on the work piece.

9. A parts mounting machine according to claim 8, wherein the work piece positioning device positions the table at an initialized position and causes the table to move a distance determined by the main controller, said main controller then measures a distance between the datum point of the table and the datum point of the parts handling unit and calculates and memorizes a sum total of the moved distance and the measured distance as an actual distance between the datum point of the parts handling unit and a table reference point.

10. A parts mounting machine according to claim 9, wherein the main controller calculates a required distance between the table reference point and the datum point of the table in accordance with the distance between the datum point of the table and the datum side of the work piece, and the distance between the datum point of the parts handling unit and the table reference point on the basis of the compensated-positioning data so that a positional relation between the datum side of the work piece and the datum point of the handled part is correctly controlled.

11. A parts mounting machine comprising:
   a work piece positioning device having a movable table for positioning a work piece at a predetermined location thereon;
   a parts handling unit detachably fixed to the work piece positioning device, further comprising:
   mounting head means fixedly attached to the unit, for holding a part and for mounting the part onto the work piece;
   transfer means fixedly attached to the unit, for transferring the part from a container of parts to the mounting head means and the transfer means; and
   branch control means, for controlling the mounting head means and the transfer means; and
   a main controller, for controlling the branch control means so that the part handling unit cooperates with the work piece positioning device.

* * * * *